United States Patent
Eser et al.

(10) Patent No.: US 8,168,256 B2
(45) Date of Patent: May 1, 2012

(54) FORMATION OF SELENIDE, SULFIDE OR MIXED SELENIDE-SULFIDE FILMS ON METAL OR METAL COATED SUBSTRATES

(75) Inventors: Erten Eser, Newark, DE (US); Shannon Fields, Wilmington, DE (US)

(73) Assignee: Erten Eser, Newark, DE (US)

( * ) Notice: Subject to any disclaimer, the term of this patent is extended or adjusted under 35 U.S.C. 154(b) by 868 days.

(21) Appl. No.: 11/577,777

(22) PCT Filed: Oct. 21, 2005

(86) PCT No.: PCT/US2005/037711
§ 371 (c)(1),
(2), (4) Date: Jul. 29, 2008

(87) PCT Pub. No.: WO2006/047207
PCT Pub. Date: May 4, 2006

(65) Prior Publication Data
US 2009/0017207 A1    Jan. 15, 2009

Related U.S. Application Data (60) Provisional application No. 60/620,352, filed on Oct. 21, 2004.

(51) Int. Cl.
*C23C 16/00* (2006.01)
*C23C 16/06* (2006.01)
(52) U.S. Cl. .............. 427/248.1; 427/250; 427/255.23; 427/255.29; 427/255.31
(58) Field of Classification Search ............. 427/248.1, 427/250, 255.23, 255.29, 255.31
See application file for complete search history.

(56) References Cited

U.S. PATENT DOCUMENTS

| | | | | |
|---|---|---|---|---|
| 6,310,281 B1 * | 10/2001 | Wendt et al. | | 136/256 |
| 6,372,538 B1 * | 4/2002 | Wendt et al. | | 438/95 |
| 2005/0186342 A1 * | 8/2005 | Sager et al. | | 427/248.1 |

FOREIGN PATENT DOCUMENTS

WO    2005015645    2/2005

OTHER PUBLICATIONS

Jensen, et al., "Back Contact Cracking During Fabrication of CIGS Solar Cells on Polyimide Substrates," *NCPV and Solar Program Review Meeting* Mar. 24-26, 2003, pp. 877-881.
Eser et al., in "Critical Issues in Vapor Deposition of Cu(InGa)Se2 on Polymer Web: Source Splitting and Back Contact Cracking," in Photovoltaics Specialists Conference, Thirty-first IEEE Conference Proceedings, Jan. 2005, pp. 515-518.
Abstract for Eser et al., in "Critical Issues in Vapor Deposition of Cu(InGa)Se2 on Polymer Web: Source Splitting and Back Contact Cracking," in Photovoltaics Specialists Conference, Thirty-first IEEE Conference Proceedings, Jan. 2005, pp. 515-518.

* cited by examiner

*Primary Examiner* — Kelly M Gambetta
(74) *Attorney, Agent, or Firm* — RatnerPrestia (57) ABSTRACT

A process and composition for preventing cracking in composite structures comprising a metal coated substrate and a selenide, sulfide or mixed selenide sulfide film. Specifically, cracking is prevented in the coating of molybdenum coated substrates upon which a copper, indium-gallium diselenide (CIGS) film is deposited. Cracking is inhibited by adding a Se passivating amount of oxygen to the Mo and limiting the amount of Se deposited on the Mo coating.

12 Claims, 6 Drawing Sheets

FORMATION OF SELENIDE, SULFIDE OR MIXED SELENIDE-SULFIDE FILMS ON METAL OR METAL COATED SUBSTRATES

CROSS-REFERENCE TO RELATED APPLICATIONS

This application is the National Phase of International Application No. PCT/US2005/037711 filed on Oct. 21, 2005; and this application claims priority to Application No. 60/620,352 filed in the United States on Oct. 21, 2004 under 35 U.S.C. §119(e); the entire contents of all are hereby incorporated by reference.

STATEMENT REGARDING FEDERALLY SPONSORED RESEARCH OR DEVELOPMENT

This invention was developed under a grant no. AdJ-1-30630-12 from the National Renewable Energy Laboratories.

BACKGROUND OF THE INVENTION

The invention is directed to a new process and a new composition of matter. It deals with the formation of selenide, sulfide, and mixed selenide-sulfide on metal or metal coated substrates requiring temperatures in excess of 200° C. Specifically, it solves the problem of crack formation which commonly occurs when copper, indium, gallium, diselenide, i.e., $CuInGaSe_2$ (CIGS) is deposited onto a molybdenum coated substrate. It also improves the adhesion of the CIGS film to the Mo layer. In the past, both of these issues have impeded the development of CIGS based photovoltaic (PV) devices on flexible polymer substrates.

In a more general way, the invention also applies to other substrates as well, such as Mo coated glass and Mo coated metal foils, as well as glass, polymer and metal foil substrates coated with niobium (Mb), tantalum (Ta), tungsten (W), titanium (Ti), for example. The invention further applies to methods of forming CIGS films by selenization of precursors films. Such precursor films can include metals or compounds in the form of uniform layers or powders as long as the selenide, sulfide or mixed selenide-sulfide is formed on metal film such as, for example, Mo, Ta, W, and TI. In cases where selenide or mixed selenide-sulfide films are formed directly on metal foils, the invention improves the adhesion of the film to the substrate.

Figure 1:
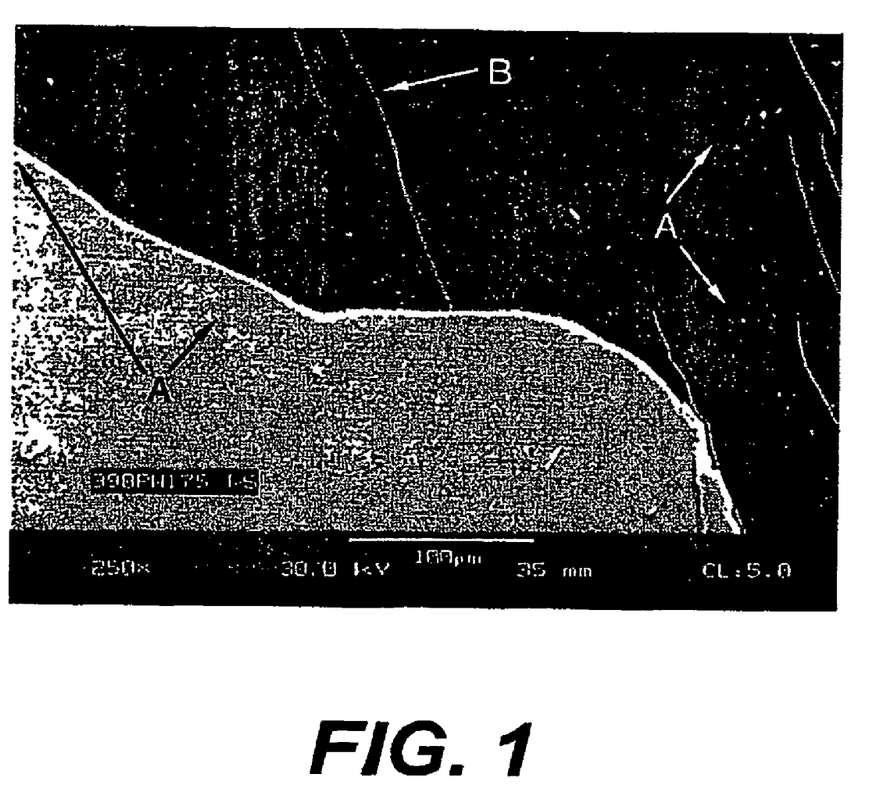
FIG. 1 is a SEM micrograph showing cracks on both Mo film (dark area) and on the CIGS layer (bright area)
Figure 2A:
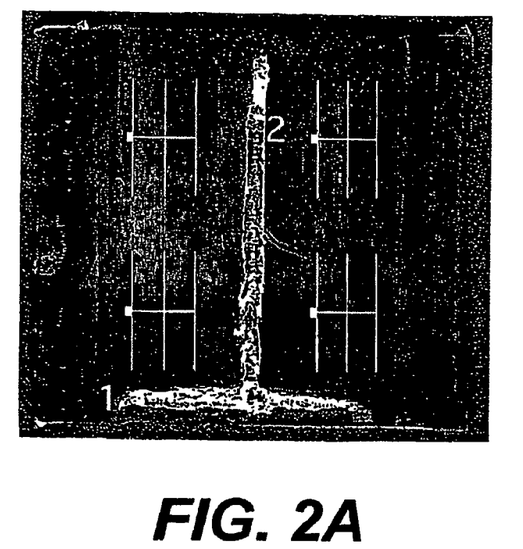
FIG. 2a is a photograph of a sample with 4 CIGS devices fabricated on a cracked Mo back contact.
Figure 2B:
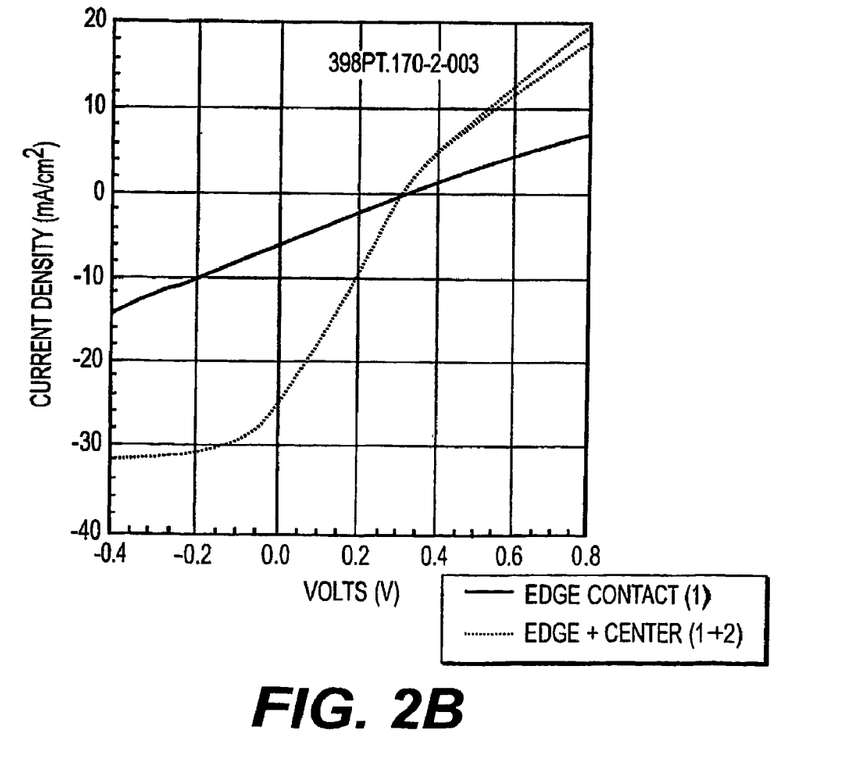
FIG. 2b shows a JV characteristic of one of the devices in utilized back contact 1 alone and 1 and 2.

An example of the cracking found in prior art composite films can be seen in the Scanning Electron Microscopy (SEM) micrograph shows in FIG. 1 where the CIGS layer (white area) was deposited on a Mo film (dark area) which coated a polyimide film. Such cracks dramatically reduce the performance of CIGS based PV devices. This consequently is illustrated in FIGS. 2a and 2b. FIG. 2a is the photograph of a sample containing 4 devices. On the same there are two orthogonal contact lines (labeled 1 and 2 in FIG. 2.2a) to the underlying Mo film that is the electrical back contact to the devices. FIG. 2b gives the current density vs voltage (JV) characteristics of one of the devices utilizing one and both of the contact lines. When only the contact line 1 is used, current collection from the device is severely limited compared to the case when contact line 2 is placed orthogonal to line 1. The explanation for this is that, in this particular case, the cracks are mostly parallel to contact line 1 and therefore current can't be collected by the contact line 1 alone.

U.S. Pat. Nos. 6,310,281 B1 and 6,372,538 B1 dated respectively Oct. 30, 2001 and Apr. 16, 2002 allege that during the fabrication of CIGS photovoltaic modules on polyimide substrates, cracking of sputter deposited Mo layer during subsequent downstream processing can be avoided by the addition of oxygen or water vapor into the sputtering gas. These disclosures allege that as a result of this addition of oxygen or water vapor into the sputtering gas, oxygen is entrained into the Mo layer creating a higher level of internal compressive stress in the Mo layer as a result of which "these layers are able to lerate temperature changes that occur in subsequent processing without suffering temperature-induced cracking and fracturing." However, these patents fail to state the amount of oxygen entrained into the films, and instead, give the range of the relative amount of water vapor or oxygen in the sputtering gas. The amount of oxygen in the Mo is intimately related to the design and operation of the sputtering system used for the deposition of Mo layers. These patents do not suggest an amount of oxygen concentration in the Mo film which is necessary to suppress the cracking of such films during the fabrication of CIGS photovoltaic modules. Indeed, studies to the issuance of these patents have concluded without exception, that Mo cracking is an unresolved problem.

BRIEF SUMMARY OF THE INVENTION

The present invention is at least based on the discovery that the root cause of the cracking in Mo films is a chemical reaction with Se, which reduces the yield strength of the film. Consequently, this invention utilizes means for inhibiting this chemical reaction by limiting the exposure of the Mo film to Se and by incorporating oxygen into the Mo at concentrations high enough to passivate against reaction with Se.

Thus, the invention comprises new compositions of matter and a process which includes inhibiting the reaction of Mo with Se during the formation of CIGS films. For example, with reference to the vapor disposition of CIGS films on a Mo coated substrate in a roll-to-roll system, the process of this invention comprises:

providing a substrate which is coated with Mo containing a sufficient amount of oxygen to passivate against Se, introducing the Mo coated substrate into a chamber means for vapor depositing Se, Cu, In, Ga fluxes onto the surface of the Mo coating, said chamber means containing a separate, substantially isolated vapor deposition zone, simultaneously depositing Se, Cu, In and Ga onto the Mo coated substrate within the deposition zone, limiting the amount of Se deposited on the Mo coated substrate to only that amount required to form a CIGS film thereon.

DESCRIPTION OF THE PREFERRED EMBODIMENT

The invention is based on a set of experiments. During these experiments CIGS films were deposited, in a roll-to-roll deposition reactor, on Mo coated Upilex-S polyimide web.

These experiments compared the Mo cracking and adhesion of the CIGS films to Mo for depositions performed under conditions of high and a factor of 10 lower levels of selenium (Se) vapor. Table I summarizes these results and also gives the composition of the CIGS films.

Consumption of Se was estimated by measuring Se level in the source before and after certain number of runs. Adhesion results were estimated from the amount of film lifted off by 40 oz/" tape. In order to evaluate cracking of Mo under the CIGS a 1"×1" sample was cut and CIGS was removed from the corners. Then indium solder was placed over the four corners. Resistance between two diagonal corners relative to the same resistance on the unprocessed Mo coated Upilex-S gives an indication of the severity of cracking. It should be pointed out that even though resistance of the Mo film was used to quantify the degree of cracking, these cracks are visually observable since they in turn cause the cracking of the CIGS film deposited over the Mo layer. In evaluating cracking and adhesion it is prudent not to take into account the runs grayed in the Table I because of the large compositional deviations in the films from single phase CIGS.

Examination of the data in the Table I show that reducing the amount of Se co-evaporated along with copper (Cu), indium (In), and gallium (Ga) while still maintaining enough to form the CIGS compound, reduces crack density on the Mo layer and improves adhesion of the CIGS film to Mo layer. The process seems to be the chemical reaction of the excess Se with Mo structurally weakening Mo layer and thus causing cracking due to stresses associated with roll-to-roll processing of flexible web. Mo—Se reaction also seems to result in reducing adhesion of CIGS to Mo probably as a consequence of the formation of structurally weak reaction by-products at the interface.

TABLE I

Cracking and CIGS / Mo adhesion of CIGS films deposited under different Se consumption levels.

| Run# | Date | Substrate | CuInGaSe$_2$ Film Composition ||||| Cracking Diag. R ($\Omega$) | Adhesion 40 oz/'" tape | Se operation | Comments |
| | | | Cu (at %) | In (at %) | Ga (at %) | Se (at %) | Cu/In + Ga | Ga/In + Ga | | | | |
|---|---|---|---|---|---|---|---|---|---|---|---|---|
| 70209 | May 16, 2003 | TM23930.A | 24.6 | 19.7 | 6.6 | 49.1 | 0.94 | 0.25 | 348 | poor | source full @ start | |
| 70210 | May 19, 2003 | TM23930.A | 24 | 19.3 | 7.4 | 49.3 | 0.90 | 0.28 | 721 | poor | same as 209 | |
| 70211 | May 21, 2003 | TM23930.A | 27.5 | 24.9 | 10.5 | 37.2 | 0.78 | 0.30 | 2 | NA | same as 209. No 1st pass. Source 30 mm below top @ end. 10 to 12 mm run consumption | |
| 70213 | May 27, 2003 | TM23930.A | 22.9 | 21.7 | 5.8 | 49.7 | 0.83 | 0.21 | 412 | poor | same as 209 | |
| 70215 | Jun. 9, 2003 | TM23930.A | 25.1 | 19 | 7.6 | 48.3 | 0.94 | 0.29 | 6 | good | source full @ start | new Cu boat |
| 70216 | Jun. 18, 2003 | TM23930.B | 42.8 | 12 | 4.3 | 40.9 | 2.63 | 0.26 | 9 | good | same as 215 | abort after 30 min |
| 70217 | Jun. 20, 2003 | TM23930.B | 26.7 | 20.4 | 4.5 | 48.5 | 1.07 | 0.18 | 57 | good | same as 215 | |
| 70218 | Jun. 25, 2003 | TM23940.B | 23.5 | 20.7 | 6.3 | 49.5 | 0.87 | 0.23 | 461 | good | same as 215 | |
| 70219 | Jul. 1, 2003 | TM23940.B | 16.3 | 24.29 | 6.5 | 52.9 | 0.53 | 0.21 | 955 | good | same as 215. 5 mm below top @ end. 1 mm/run consumption | |

Note:
Diagonal resistance on the Mo coated substrates prior to CuInGaSe$_2$ deposition measured around 2$\Omega$.

Figure 3:
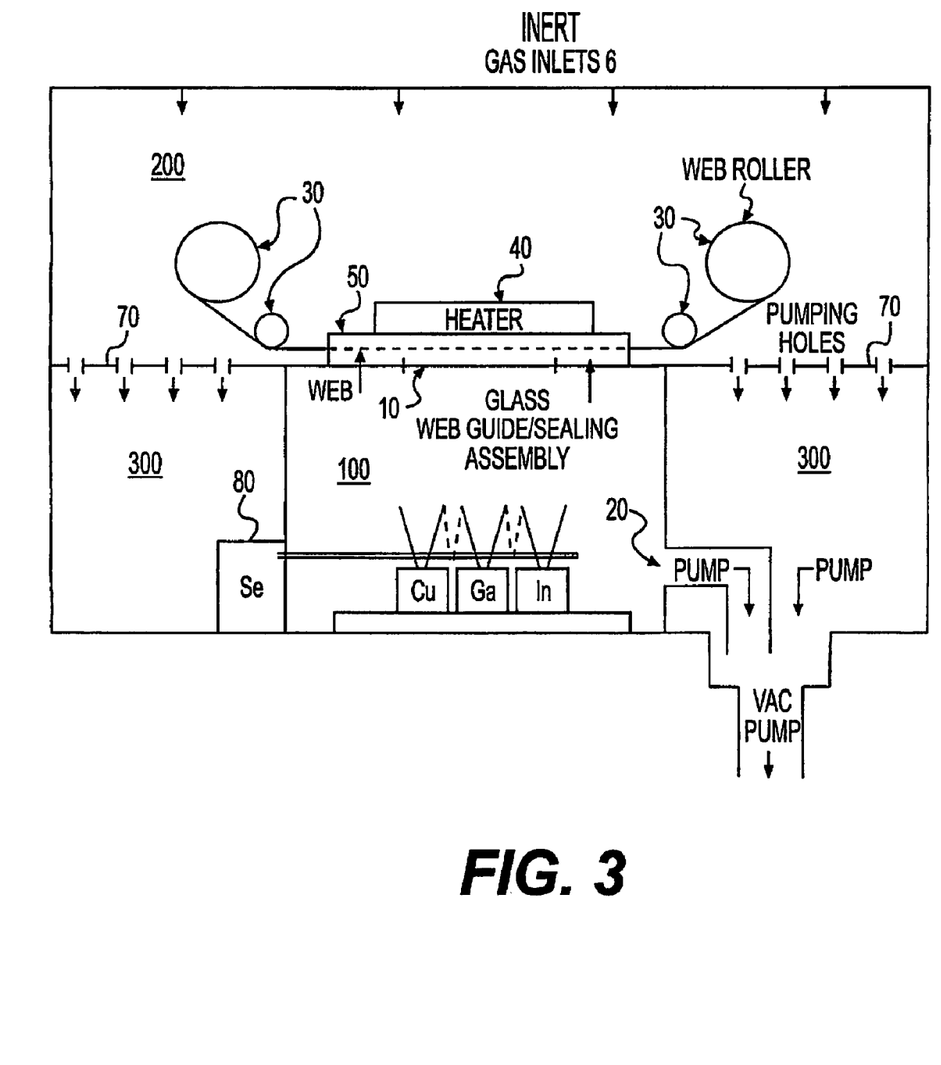
FIG. 3 is a roll-to-roll reactor for the physical vapor deposition of CIGS films onto a web type substrate.
Figure 4A:
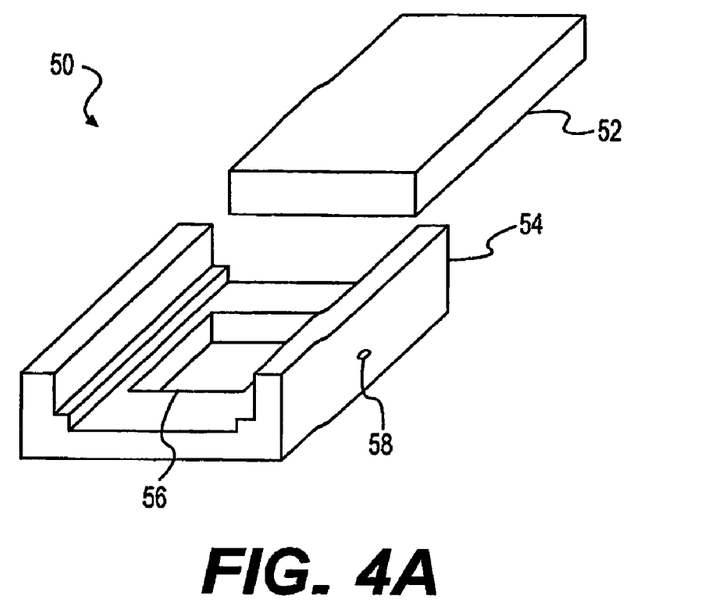
FIG. 4a is an exploded schematic view of the web guide.
Figure 4B:
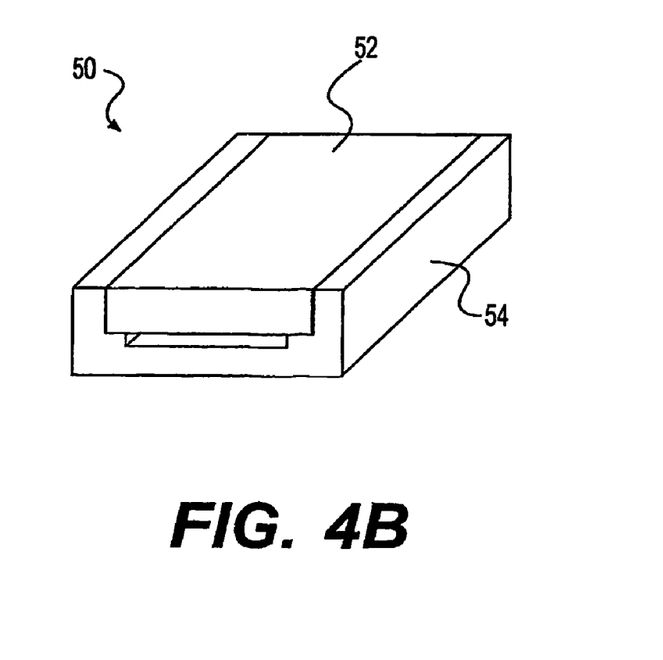
FIG. 4b is a schematic view of the web guide with upper and lower sections fitted together.

FIG. 3 shows schematically a roll-to-roll reactor for the physical vapor deposition of CIGS films onto a web type substrate that incorporates the methods described above. The reactor is divided into three regions. Region 100 contains evaporation sources and is isolated from the other regions except for the rectangular deposition zone opening (10) where the evaporation materials condense on the web and the pumping port (20) connecting Region 100 to the vacuum pump. Web transport (30) and heating components (40) are located in Region 200. In addition, a web guide (50) is also located in Region 200 positioned right over the deposition zone. The web guide, shown in more detail in FIG. 4, serves multiple operational purposes. It has an upper section (52) and a lower section (54) that snugly fit each other forming a rectangular tunnel, slightly larger in width than the web, through which the web substrate is transported. The height of the tunnel is no larger than twice the substrate thickness. The guide's lower section has an opening (56) that is aligned with the deposition zone opening (1) of FIG. 3. The holes (58) on the sides of the lower section of the web guide are for temperature sensors, such as thermocouples, for the measurement and control of the web temperature. The sections of the web guide extending upstream and downstream from the deposition zone serves to create very low gaseous conductance to isolate Region 100 from Region 200 and therefore minimize the leakage of Se/S into the Region 200. It is preferred to have the web guide made out of an infrared (IR) transmitting glass such as Vicor or quartz so that it doesn't interfere with the heating of the web substrate. It is also preferred to have all the surfaces of the web guide "flame polished" to reduce the risk of damaging the substrate and to reduce the risk of breakage of the guide itself during heating and/or cooling. Another advantage of using glass as the material of construction for the web guide is its inertness towards reaction with Se and/or S. As a result, periodic maintenance cleaning of the guide will be relatively easier. Another advantage of the web guide is the fact that it acts as a support for the web. In the case of high throughput processing, web speed has to be increased. In order to keep CIGS film thickness unchanged it is necessary to increase the deposition zone length to accommodate larger number of sources. Under these conditions the sagging of the web is unavoidable and becomes a problem. However, this problem is avoided when a web guide is used, since the guide supports the weight of the web during its transition through the deposition zone.

In order to further reduce the leakage of Se/S from Region 100 into Region 200 a gas purge is established in Region 200. A flow of gas is introduced into the Region 200 through inlets (6) and is pumped out through pumping holes (70) into Region 300 as shown in FIG. 3. The flow rate and the conductance of the holes (70) are adjusted to provide an excess of pressure in Region 200 relative to Region 100. Region 300 would contain all other components required for the operation of the system.

Figure 5:
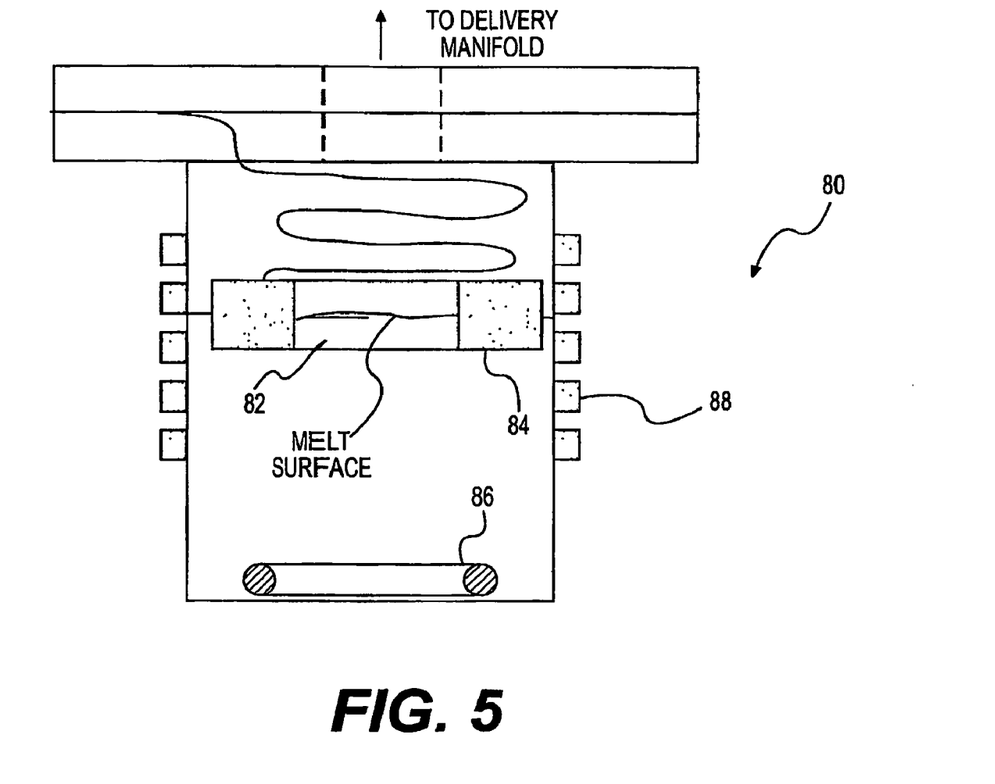
FIG. 5 is a schematic of a Se/S source.

For such a system to operate efficiently it is necessary to accurately control Se effusion rate and keep it to a minimum level as required by the formation of the CIGS film on the moving substrate. This requires an accurate control of the surface temperature of the liquid Se (or S) in the source, which in turn sets the vapor pressure in the source above the melt. Se/S have high vapor pressures at moderately low temperatures such that operational surface temperatures are expected to be in the range of 200° C. to 400° C. and should be colder than the upstream delivery manifold to avoid condensation therein. This high temperature manifold provides an uncontrollable heat flow into the source. FIG. 5 shows schematically a Se/S source 80 that provides a workable solution to the difficulties mentioned above. The surface temperature of the melt is measured and controlled by the sheathed thermocouple (82) attached to a ring shaped float (84). In this way, irrespective of the melt level, thermocouple (852) always indicates the melt surface temperature. The float material can be glass or graphite and can have a sealed internal cavity to increase buoyancy especially in the case of S evaporation. Cooling coil (86) through which water flows at controlled rates provides adjustable heat removal to balance heat load to the source mainly through the manifold. The system is then able to control low melt surface temperatures by the external heater (88) with feedback from thermocouple (82).

Methods that would inhibit the reaction of Mo with Se are based on the principle that reactivity of Mo to Se can be suppressed by adding oxygen in sufficient concentrations to Mo. The reason behind this approach is that the Gibbs free energy of the reaction of Mo with oxygen is lower than the Gibbs free energy of the reaction of Mo with Se or S. For illustration purposes Gibbs free energy for some of the selenization, sulfurization and oxidation reactions of Mo at 700 K (427° C.) are given below:

| | |
|---|---|
| $Mo + Se_2 = MoSe_2$ | $\Delta Grx = -164$ kJ/mol |
| $Mo + \frac{1}{4}Se_8 = MoSe_2$ | $\Delta Grx = -142$ kJ/mol |
| $3Mo + 2Se_2 = Mo_3Se_4$ | $\Delta Grx = -363$ kJ/mol |
| $Mo + S_2 = MoS_2$ | $\Delta Grx = -270$ kJ/mol |
| $Mo + \frac{1}{4}S_8 = MoS_2$ | $\Delta Grx = -249$ kJ/mol |
| $2Mo + \frac{3}{2}S_2 = Mo_2S_3$ | $\Delta Grx = -403$ kJ/mol |
| $Mo + \frac{3}{2}O_2 = MoO_3$ | $\Delta Grx = -566$ kJ/mol |
| $Mo + O_2 = MoO_2$ | $\Delta Grx = -467$ kJ/mol |

These reaction energies imply that Mo films may be passivated against Se and/or S by introducing an appropriate amount of oxygen into the Mo film. The amount of oxygen in the Mo film has to be larger than a minimum level to be effective in passivating against chemical reactions with Se and/or S. Passivation against Se and against S would require different minimum level of oxygen in the film. As will be described later (paragraph B3), in the case of Mo sputter-coated polyimide substrates, 3 to 4 atomic percent oxygen was found to be inadequate for passivation against Se and thus resulted in cracking of Mo film and low adhesion of the CIGS film to Mo. However, 6 to 8 atomic percent oxygen prevented Mo cracking and resulted in better adhesion of CIGS film to Mo.

Oxygen will also passivate other metal films such as tungsten (W), chromium (Cr), tantalum (Ta), niobium (Cb), vanadium (V), titanium (Ti), and others susceptible to reaction with selenium and/or sulfur during deposition of selenide, sulfide, and mixed selenide/sulfide films on them. This is because oxidation reactions have lower Gibbs free energy than the selenization or sufurization reactions. However, the minimum oxygen level for passivation would be different for different metal films.

Method of forming the metal films would also control the minimum oxygen level for passivation as they would give different structures to the films. It should also be emphasized that the type of the selenide, sulfide, and the mixed selenide/sulfide film and the method of forming it will affect the minimum oxygen level for passivation. Therefore, in general, the minimum oxygen level for passivation has to be determined experimentally in each case.

Any method can be used to introduce oxygen into the metal films as long as it does not degrade operational characteristics of the films that would be defined by the user. In the case of Mo films or other films of refractory metals, the preferred method of film forming being sputtering, the oxygen can be introduced by mixing oxygen gas or other oxygen containing gas to the sputtering gas such as argon. The percentage of the oxygen or oxygen containing gas in the sputtering gas has to be determined experimentally to give the desired oxygen level in the Mo film. This is because the amount of oxygen in the sputtering gas mixture is not sufficient, by itself, to determine the oxygen concentration in the metal film. In fact, for a given gas concentration, the amount of oxygen in the film can differ greatly from one system to another.

Since the purpose of oxygen is to passivate Mo film against reaction with Se and/or S it would be sufficient to oxygenate the top portion of the film in order to achieve the desired effect rather than introduce oxygen throughout the thickness of the metal film. As will be shown in Section B3, oxygenation of the top 1000 Å of 2000 Å Mo film was adequate for the passivation of the entire film. In this instance, as well, the thickness of the oxygenated top layer need be determined experimentally. It should be pointed out that oxygenated top layer need not be deposited at the same time and in the same reactor as the non-oxygenated bottom portion of the metal film.

In the case of polyimide films, which always contain a certain percentage of water, the metal film can be passivated by allowing the polyimide be heated naturally by the sputtering plasma. In this case, the water in the polyimide outgases during the deposition of the metal thus providing the oxygen necessary for passivation. It will be shown in Section B3 that this method of oxygenation also gave satisfactory results.

system which produced such a product consists of two targets 3 inches apart facing a web carrier drum over which polyimide web is stretched. The drum rotates in synchronization with the web translation to avoid sliding of the web over its surface. Heating of the web due to the sputtering plasmas is limited due to the drum acting as a heat sink. The drum can be actively refrigerated to further limit web temperature, though in the present this was not the case. All the Mo films discussed here are approximately 2000 Å thick. This initial material showed substantial cracking during the deposition of CIGS films. Subsequently Mo deposition conditions were modified to obtain a Mo film that would not crack during CIGS deposition. Two Mo runs on Upilex S were conducted under the same conditions as a previous deposition, identified as TM24312.2B, which resulted in heavy film cracking, except for two changes. In the first run the web tension was reduced as much as possible allowing the web temperature to rise. In the second case, 5% oxygen was introduced into the sputtering gas directed onto the second target from which top half of the total Mo thickness is deposited. These two runs were identified as TM24961.1 and TM24961.2 respectively.

CIGS films were deposited on these substrates in an inline reactor. The composition of the CIGS films were found to be similar, as shown in Table 3.1, but the film on substrate TM243 12.2B showed cracking while films on substrates TM24961.1 and TM24961.2 had no observable cracks.

TABLE 3.1

Composition of CIGS Mo coated films deposited on different Upilex S substrates.

| Run# | Substrate | Cu (at %) | In (at %) | Ga (at %) | Se (at %) | Cu/In + Ga | Ga/In + Ga |
|---|---|---|---|---|---|---|---|
| 70227 | TM24312.2B | 24.0 | 21.0 | 6.1 | 48.8 | 0.89 | 0.23 |
| 70261 | TM24961.1 | 24.2 | 17.9 | 8.7 | 49.3 | 0.91 | 0.33 |
| 70262 | | 22.0 | 18.2 | 8.2 | 51.6 | 0.83 | 0.31 |
| 70264 | TM24961.2 | 24.0 | 18.5 | 8.0 | 49.6 | 0.91 | 0.30 |
| 70265 | | 24.4 | 18.7 | 7.6 | 49.3 | 0.93 | 0.29 |

The invention identifies reaction between Se/S and metal film substrate as being detrimental to the mechanical integrity (i.e. cracking) of both the metal and selenide/sulfide films and also being the cause of reduced adhesion between the metal and the selenide/sulfide films. It solves these problems by suppressing the reaction between the metal film and Se/S through process related techniques and through the addition of oxygen, above a certain minimum level, into the metal film passivating it against reaction with Se/S.

Present technology doesn't provide a solution to the cracking of metal and selenide/sulfide films. In fact, at the present time, the technology favors an oversupply of Se/S during the formation of the selenide/sufide films aggravating the problem.

Applications could extend beyond photovoltaics where selenide and/or sulfide films are deposited on metal and metal coated substrates. Also, web guide/sealing assembly can be used in any web coating application to seal the web transport section from the coating section.

Following is the summary of the experiments testing the invention.

Figure 6A:
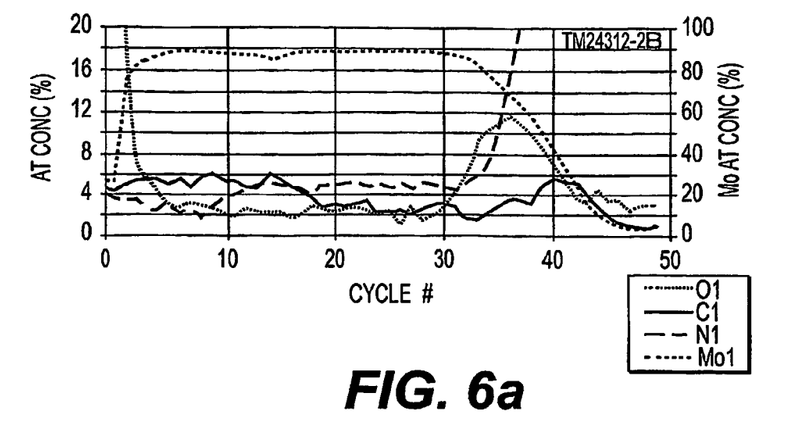
FIG. 6a is an auger depth profile of reference Mo film TM24312.2B.
Figure 6B:
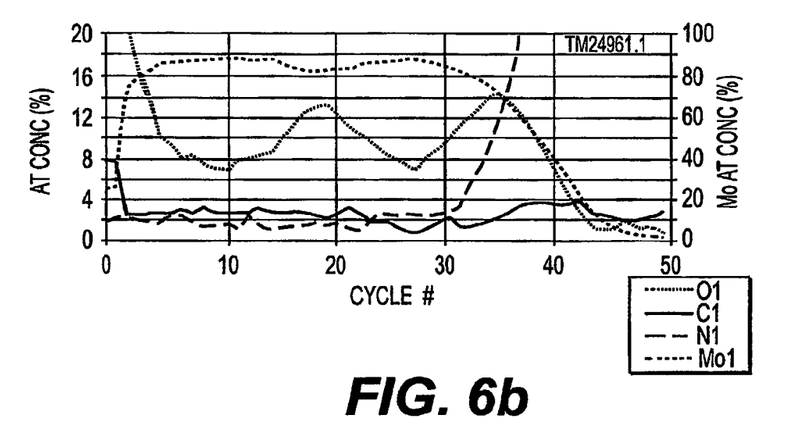
FIG. 6b is an auger depth profile of a film TM 24961.1 having low web tension.
Figure 6C:
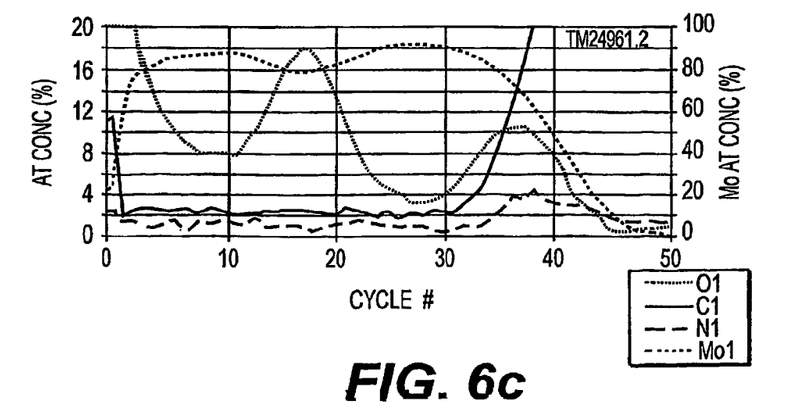
FIG. 6c is an auger depth profile of a film TM24961.2 with 5% oxygen over the second target.

A Upilex S polyimide sputter coated with Mo was used in a roll-to-roll CIGS deposition process. The sputter deposition Auger depth profiles of these three Mo films are shown in FIGS. 6a-6c and highlight the differences in the oxygen content. In the case of the reference film, TM24312.2B, the oxygen content of the film is between 2 to 3 at % in the top and bottom half of the film corresponding to the deposition from the second and first target respectively. Oxygen peak of in the middle of the film corresponds to the gettering of background oxygen by the freshly deposited film during transit between the two targets. The peak concentration doesn't have much meaning since the depth resolution in the data is rather poor.

Mo film TM24961.1 shows qualitatively the same oxygen distribution but the amount of oxygen in the top and bottom half of the film is approximately around 7 at %. The source of this oxygen is water desorbing from the polyimide as a result of heating by the sputtering plasmas due to the fact that there is very little heat removal by the backing drum because of the low web tension. Again there is an oxygen peak in the middle of the film due to the gettering by the freshly deposited 1$^{st}$ half of the film.

Mo film TM24961.2 again has qualitatively similar oxygen distribution but in this case there is an intentional injection of oxygen onto the second target. As a result in the top half of the film, oxygen concentration is around 8 at % while in the bottom half is around 4 at % closer to the value in the reference film. Again there is a peak in the oxygen distribution in the middle of the film.

The absence of any observable film cracking on substrates TM24961.1 and TM24961.2 is associated with the adequate oxygen concentrations in the Mo films, which in the present case is around 6 to 8 at %. Based on the data from the reference film 3 at % oxygen is not enough to suppress cracking. It is important to point out that 8 at % oxygen in the top half of the film while the bottom half has 4 at % suppresses the crack formation. This is an indication that the process of crack formation involves the top of the Mo film rather than the full thickness of the film.

Table 3.2 gives the device performance data on the CIGS solar cells fabricated on the materials discussed above. Data convincingly shows that, devices fabricated on oxygen containing Mo films outperform the ones fabricated on the reference Mo. This is not surprising in view of the film cracking observed on the latter.

TABLE 3.2

Solar cell parameters of the CIGS devices on TM24312.2B, TM24961.1 and TM24961.2 substrates

| Sample # | Cell # | Substrate | Eff (%) | FF (%) | Voc (V) | Jsc (mA/cm2) | Roc (Ω-cm2) | Gsc (mS/cm2) |
|---|---|---|---|---|---|---|---|---|
| 70227.211 | 1 | TM24312.2B | 2.1 | 23.7 | 0.407 | 22.1 | 24.1 | 42.3 |
|  | 2 |  | 2.7 | 26.9 | 0.423 | 23.7 | 17.0 | 36.3 |
|  | 3 |  | 1.7 | 22.6 | 0.368 | 21.0 | 21.4 | 56.4 |
|  | 4 |  | 2.5 | 25.2 | 0.403 | 24.9 | 18.5 | 45.2 |
| 70227.212 | 1 |  | 2.2 | 24.1 | 0.384 | 23.5 | 22.2 | 46.7 |
|  | 2 |  | 2.7 | 25.4 | 0.409 | 25.8 | 17.1 | 44.0 |
|  | 3 |  | 2.3 | 26.4 | 0.361 | 24.3 | 18.2 | 40.4 |
|  | 4 |  | 2.6 | 26.0 | 0.391 | 25.8 | 15.8 | 46.5 |
| 70227.221 | 1 |  | 1.9 | 22.0 | 0.409 | 21.6 | 23.8 | 54.1 |
|  | 2 |  | 2.1 | 23.1 | 0.414 | 22.3 | 20.7 | 51.0 |
|  | 3 |  | 2.0 | 22.6 | 0.394 | 22.9 | 22.9 | 48.8 |
|  | 4 |  | 2.3 | 24.1 | 0.423 | 22.9 | 22.5 | 39.8 |
| 70227.222 | 1 |  | 1.7 | 22.3 | 0.373 | 20.3 | 24.0 | 52.2 |
|  | 2 |  | 2.1 | 22.8 | 0.403 | 23.0 | 19.7 | 54.5 |
|  | 3 |  | 2.2 | 23.5 | 0.391 | 24.2 | 19.4 | 50.6 |
|  | 4 |  | 2.3 | 22.9 | 0.402 | 24.8 | 18.4 | 54.8 |
| 70261.12A | 1 | TM24961.2 | 10.4 | 58.0 | 0.536 | 33.5 | 4.3 | 0.9 |
|  | 2 |  | 10.3 | 58.9 | 0.537 | 32.6 | 3.9 | 11.0 |
|  | 3 |  | 11.0 | 61.7 | 0.537 | 33.1 | 3.7 | 2.2 |
|  | 4 |  | 10.8 | 61.2 | 0.536 | 33.0 | 3.6 | 2.1 |
| 70261.12B | 1 |  | 8.8 | 51.3 | 0.530 | 32.5 | 5.9 | 3.8 |
|  | 2 |  | 9.0 | 50.6 | 0.527 | 33.6 | 5.6 | 7.4 |
|  | 3 |  | 9.4 | 55.1 | 0.535 | 32.0 | 5.5 | 2.9 |
|  | 4 |  | 9.2 | 52.4 | 0.527 | 33.4 | 5.4 | 7.2 |
| 70262.22A | 1 |  | 8.4 | 49.7 | 0.512 | 33.0 | 6.9 | 3.4 |
|  | 2 |  | 8.7 | 52.1 | 0.509 | 32.7 | 6.2 | 2.9 |
|  | 3 |  | 3.0 | 25.1 | 0.502 | 23.9 | 21.2 | 30.2 |
|  | 4 |  | 9.3 | 53.3 | 0.515 | 33.7 | 6.3 | 1.6 |
| 70262.22B | 1 |  | 8.2 | 47.5 | 0.517 | 33.3 | 7.8 | 3.1 |
|  | 2 |  | 8.0 | 49.5 | 0.512 | 31.7 | 7.4 | 2.5 |
|  | 3 |  | 9.0 | 52.4 | 0.514 | 33.5 | 6.8 | 4.2 |
|  | 4 |  | 8.7 | 52.9 | 0.510 | 32.4 | 6.7 | 3.0 |
| 70264.21 | 1 | TM24961.1 | 9.4 | 56.5 | 0.508 | 32.6 | 4.4 | 1.6 |
|  | 2 |  | 9.8 | 57.7 | 0.509 | 33.5 | 4.2 | 2.0 |
|  | 3 |  | 10.1 | 60.5 | 0.509 | 32.7 | 3.7 | 4.8 |
|  | 4 |  | 10.0 | 58.8 | 0.510 | 33.3 | 3.9 | 3.5 |
| 70264.22 | 1 |  | 9.1 | 54.8 | 0.505 | 32.7 | 5.3 | 5.8 |
|  | 2 |  | 9.4 | 56.3 | 0.509 | 32.9 | 4.7 | 0.6 |
|  | 3 |  | 8.4 | 52.1 | 0.508 | 31.8 | 5.4 | 2.4 |
|  | 4 |  | 8.1 | 50.4 | 0.501 | 32.1 | 5.6 | 7.7 |
| 70265.12 | 1 |  | 10.5 | 63.6 | 0.500 | 33.0 | 2.8 | 5.6 |
|  | 2 |  | 10.6 | 63.8 | 0.504 | 32.9 | 2.8 | 5.0 |
|  | 3 |  | 10.7 | 65.8 | 0.499 | 32.5 | 2.4 | 0.8 |
|  | 4 |  | 10.8 | 65.9 | 0.502 | 32.6 | 2.4 | 4.0 |
| 70265.22 | 1 |  | 10.5 | 63.2 | 0.503 | 33.0 | 3.0 | 3.7 |
|  | 2 |  | 10.5 | 63.5 | 0.505 | 32.8 | 3.0 | 2.7 |
|  | 3 |  | 10.1 | 62.3 | 0.508 | 32.0 | 3.0 | 4.1 |
|  | 4 |  | 9.8 | 60.7 | 0.503 | 32.2 | 3.2 | 1.9 |
| 70265.32 | 1 |  | 10.0 | 60.9 | 0.505 | 32.6 | 3.5 | 12.2 |
|  | 2 |  | 10.2 | 62.0 | 0.504 | 32.7 | 3.3 | 2.8 |
|  | 3 |  | 10.1 | 62.9 | 0.502 | 32.0 | 3.2 | 5.0 |
|  | 4 |  | 10.5 | 63.9 | 0.505 | 32.5 | 2.9 | 3.4 |
| 70265.42 | 1 |  | 9.8 | 60.0 | 0.502 | 32.6 | 3.9 | 1.3 |
|  | 2 |  | 10.0 | 61.1 | 0.501 | 32.8 | 3.5 | 6.4 |
|  | 3 |  | 9.9 | 62.2 | 0.501 | 31.9 | 3.3 | 1.2 |
|  | 4 |  | 10.3 | 63.3 | 0.502 | 32.2 | 3.0 | 2.5 |
| 70265.52 | 1 |  | 9.1 | 55.3 | 0.502 | 32.8 | 5.5 | 1.3 |
|  | 2 |  | 9.6 | 58.2 | 0.500 | 32.9 | 4.4 | 2.0 |
|  | 3 |  | 9.6 | 58.5 | 0.500 | 32.8 | 4.8 | 4.1 |
|  | 4 |  | 10.1 | 61.0 | 0.501 | 33.1 | 3.8 | 5.7 |

TABLE 3.2-continued

Solar cell parameters of the CIGS devices on TM24312.2B, TM24961.1 and TM24961.2 substrates

| Sample # | Cell # | Substrate | Eff (%) | FF (%) | Voc (V) | Jsc (mA/cm2) | Roc (Ω-cm2) | Gsc (mS/cm2) |
|---|---|---|---|---|---|---|---|---|
| 70265.62 | 1 | | 7.6 | 46.0 | 0.517 | 31.9 | 13.2 | 8.4 |
| | 2 | | 7.7 | 48.3 | 0.516 | 31.1 | 11.4 | 4.6 |
| | 3 | | 8.5 | 51.9 | 0.518 | 31.5 | 10.5 | 0.7 |
| | 4 | | 8.7 | 53.1 | 0.518 | 31.7 | 9.2 | 3.8 |
| 70265.72 | 1 | | 5.6 | 35.4 | 0.528 | 29.9 | 36.0 | 4.5 |
| | 2 | | 6.2 | 38.8 | 0.529 | 30.3 | 31.7 | 6.1 |
| | 3 | | 5.5 | 37.2 | 0.524 | 28.2 | 40.3 | 8.4 |
| | 4 | | 6.7 | 41.9 | 0.531 | 29.9 | 30.6 | 5.1 |

The foregoing description of the invention illustrates and describes the present invention. Additionally, the disclosure shows and describes only the preferred embodiments of the invention in the context of a formation of selenide, sulfide or mixed selenide-sulfide films on metal or metal coated substrates, but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the from or application disclosed herein. Also, it is intended that the appended claims be construed to include alternative embodiments.

We claim:

1. A method of forming a metal-coated substrate having a $CuInGaR_2$ film on a surface of the metal coating in such a manner that reaction of the metal with Se is substantially prevented, wherein R is Se or a combination of Se and S and wherein the metal is selected from the group consisting of Mo, W, Cr, Ta, Nb, V and Ti, comprising a step of:

contacting the surface of the metal coating simultaneously with Cu vapor, In vapor, Ga vapor and Se vapor under conditions that substantially avoid contacting the metal surface with Se prior to contacting it with Cu, In and Ga, said metal coating containing oxygen in an amount sufficient to inhibit reaction of the metal with Se;

wherein said contacting with Se vapor is limited to only that amount of Se required to form the $CuInGaR_2$ film.

2. The method according to claim 1, wherein the step of contacting the surface of the metal coating simultaneously with the Cu vapor, In vapor, Ga vapor and Se vapor comprises:

a) advancing the metal-coated substrate from within a chamber substantially free of Se vapor through a heated zone having an opening therein defining a $CuInGaR_2$ deposition zone on the metal-coated substrate, wherein the contacting of the surface of the metal coating occurs on the deposition zone, then advancing the metal-coated substrate out of the heated zone into an enclosed space substantially free of Se vapor; and b) maintaining a predetermined temperature at an uppermost surface of a liquid comprising molten Se to generate a flow of Se vapor from the uppermost surface, wherein the flow of Se vapor is directionally controlled to the $CuInGaR_2$ deposition zone so as to contact the surface of the metal-coated substrate while the substrate is in the heated zone.

3. The method according to claim 2 wherein the predetermined temperature is maintained by heating means and cooling means controlled by a thermocouple maintained in contact with the uppermost surface.

4. The method according to claim 2 wherein the substrate is in the form of a web and the heated zone comprises a web guide.

5. The method according to claim 2 wherein the chamber and the enclosed space are the same chamber or space.

6. The method according to claim 2 wherein the substrate is a polymeric film.

7. The method according to claim 1 wherein the substrate is a metal substrate.

8. The method according to claim 1 wherein the substrate is a glass substrate.

9. The method according to claim 1 wherein the metal is Mo.

10. The method according to claim 9 wherein the amount of oxygen is 6-8 atomic percent.

11. The method according to claim 1 wherein the metal is selected from the group consisting of W, Cr, Ta, Nb, V and Ti.

12. The method according to claim 2 wherein the liquid also comprises molten S.

* * * * *

UNITED STATES PATENT AND TRADEMARK OFFICE
CERTIFICATE OF CORRECTION

PATENT NO. : 8,168,256 B2
APPLICATION NO. : 11/577777
DATED : May 1, 2012
INVENTOR(S) : Erten Eser et al.

It is certified that error appears in the above-identified patent and that said Letters Patent is hereby corrected as shown below:

In the Claims:

In claim 6, column 12, line 40, delete "claim 2" and insert --claim 1--, therefor. Claim 6 is dependent upon claim 1.

Signed and Sealed this
Sixteenth Day of September, 2014

Michelle K. Lee
*Deputy Director of the United States Patent and Trademark Office*